United States Patent [19]

Hashimoto

[11] Patent Number: 5,817,368
[45] Date of Patent: *Oct. 6, 1998

[54] METHOD FOR FORMING A THIN FILM

[75] Inventor: Shinichi Hashimoto, Nagano, Japan

[73] Assignee: Fuji Electric Co., Ltd., Japan

[*] Notice: This patent issued on a continued prosecution application filed under 37 CFR 1.53(d), and is subject to the twenty year patent term provisions of 35 U.S.C. 154(a)(2).

[21] Appl. No.: 509,445

[22] Filed: Jul. 31, 1995

[30] Foreign Application Priority Data

Aug. 8, 1994 [JP] Japan ................................. 6-185708

[51] Int. Cl.⁶ .............................. B05D 5/12; B05D 3/02; C23C 16/00
[52] U.S. Cl. ..................... 427/255.3; 438/761; 438/763; 438/764; 427/255.2; 427/397.7; 427/559; 427/579; 427/101
[58] Field of Search .............................. 427/255.1, 255.2, 427/255.3, 563, 567, 568, 574, 578, 579, 397.7, 559, 101; 438/761, 763, 764

[56] References Cited

U.S. PATENT DOCUMENTS

| | | |
|---|---|---|
| 3,764,411 | 10/1973 | Brown ..................................... 438/763 |
| 4,062,034 | 12/1977 | Matsushita et al. ...................... 437/81 |
| 4,176,372 | 11/1979 | Matsushita et al. ...................... 357/52 |
| 4,199,384 | 4/1980 | Hsu ........................................ 437/84 |
| 4,260,663 | 4/1981 | Hagemann et al. ...................... 427/81 |
| 4,262,299 | 4/1981 | Ham ........................................ 357/49 |
| 4,344,985 | 8/1982 | Goodman et al. ...................... 437/244 |
| 4,420,765 | 12/1983 | Tarng ...................................... 357/54 |
| 4,433,469 | 2/1984 | Goodman ................................ 437/81 |
| 4,489,103 | 12/1984 | Goodman et al. .................... 427/255.3 |
| 4,615,908 | 10/1986 | Behn et al. ............................. 427/79 |
| 4,990,464 | 2/1991 | Baumgart et al. ...................... 438/763 |
| 5,192,714 | 3/1993 | Suguro et al. .......................... 437/195 |
| 5,200,635 | 4/1993 | Kaga et al. ............................. 257/306 |
| 5,428,244 | 6/1995 | Segawa et al. ......................... 257/646 |
| 5,470,779 | 11/1995 | Yoo ........................................ 437/60 |
| 5,470,780 | 11/1995 | Shishiguchi ............................ 437/60 |
| 5,532,183 | 7/1996 | Sugawara et al. ...................... 437/101 |
| 5,605,859 | 2/1997 | Lee ........................................ 438/763 |
| 5,688,724 | 11/1997 | Yoon et al. ............................. 438/763 |

FOREIGN PATENT DOCUMENTS 4207024 7/1992 Japan.

*Primary Examiner*—Marianne Padgett
*Attorney, Agent, or Firm*—Morrison Law Firm

[57] ABSTRACT

Alternate formation of high-resistance and low-resistance layers form a thin film with reduced dopant gradient in its thickness. A desired sheet resistance is attained by adjusting the thickness of the stacked layers, the degree of doping of the film, and the number of layers used to make the thin film during the film formation process.

16 Claims, 6 Drawing Sheets

METHOD FOR FORMING A THIN FILM

BACKGROUND OF THE INVENTION

The present invention presents a method for forming a thin film, such as the high-resistance semi-insulating thin film used in semiconductor elements. The film is used, for example, for integrated circuit surface passivation, as a diffusion barrier and as a surface dielectric. High-resistance semi-insulating thin films are especially useful near the gate electrode of a high-voltage MOSFET and near the emitter electrode of a bipolar transistor. This kind of film is also used above or below wiring as a film for protecting the wiring.

The insulating films used on some semiconductor elements are susceptible to an accumulation of electrical charge. This charge causes undesirable variations in the properties of the semiconductor element.

Conventionally, high-resistance semi-insulating films are made using $SiH_4$ and $N_2O$ as reactive gasses. The flow rate of the reactive gas, the pressure and the temperature are kept constant while a low-pressure chemical vapor deposition (CVD) is performed to form a semi-insulating silicon polycrystal membrane (SIPOS) with 10–20 percent oxygen doping. Ion implantation or thermal diffusion is used to introduce dopants, such as B, P or As, into the film, according to the required resistance.

This method of making high-resistance semi-insulating films presents the following problems:

(1) It is difficult to freely select a film having a sheet resistance of $10^5$–$10^8$ ohms, which is often the resistance required for semiconductor circuit protection. The sheet resistance of a film is defined as the electrical resistivity of a square sheet of thin film per thickness t when current flows parallel to the surface of the sheet. Sheet resistance is independent of the size of the square. The sheet resistance of a sheet of SIPOS film, having a thickness of 0.2 micrometers is $10^8$–$10^{10}$ ohms, in the absence of impurities. When impurities are introduced, the sheet resistance for a similar sheet of film is $10^2$–$10^6$ ohms. Because of this significant difference, a sheet resistance of $10^5$–$10^8$ ohms is difficult to attain by simply doping a SIPOS film.

(2) Referring to FIG. 3, the concentration distribution of a dopant P by depth is shown when P is introduced from the surface of a SIPOS film. A solid line 31 indicates gas phase diffusion of $POCl_3$. A dashed line 32 indicates the result when P ions are injected at an accelerating voltage of 30 KeV and at a dose of $2 \times 10^{16}$ ions $cm^{-2}$, then heated for 40 minutes at 900° C. As illustrated in FIG. 3, a gradient develops in the concentration of impurities at the surface and for a short distance into the film when heat is applied. It is necessary to decrease the temperature as the final stage of the process for making the semi-insulating film approaches. This required decrease in temperature creates an even steeper gradient in the concentration of impurities. When a steep gradient by depth in the concentration of impurities is present, it is difficult to allow electrical charge to escape. Thus, a charge is more likely to develop on the film.

(3) The introduction of impurities into the film to decrease the resistance requires additional steps in the film formation process, thus complicating production of the thin film.

OBJECTS AND SUMMARY OF THE INVENTION

It is an object of the present invention to provide a technique for producing a thin film which overcomes the drawbacks of the prior art.

It is another object of the present invention to provide a method for forming a thin film that can be performed with a minimum number of steps.

It is another object of the present invention to provide a method for forming a thin film that permits additional freedom in selecting the resistance of the thin film.

It is another object of the present invention to provide a method for forming a thin film that reduces a gradient in concentration of impurities near the surface of the film.

Briefly stated, alternate formation of high-resistance and low-resistance layers form a thin film with reduced dopant gradient in its thickness. A desired sheet resistance is attained by adjusting the thickness of the stacked layers, the degree of doping of the film, and the number of layers used to make the thin film during the film formation process.

According to an embodiment of the present invention, there is disclosed, a method for forming a thin film, having a prescribed sheet resistance, comprising: forming a first semiconductor layer, forming a second semiconductor layer on said first semiconductor layer, forming at least a third semiconductor layer on said second semiconductor layer, controlling a first resistivity of said first and third semiconductor layers to a value substantially higher than a second resistivity of said second semiconductor layer, and controlling said first and second resistivities to produce said prescribed sheet resistance.

According to another embodiment of the present invention, there is disclosed, a method for forming a thin film, having a prescribed sheet resistance, comprising: forming a first semiconductor layer made of SIPOS, forming a second semiconductor layer containing a dopant on said first semiconductor layer, forming at least a third semiconductor layer made of SIPOS on said second semiconductor layer, controlling a first resistivity of said first and third semiconductor layers to a value substantially higher than a second resistivity of said second semiconductor layer, and controlling said first and second resistivities to produce said prescribed sheet resistance.

According to another embodiment of the present invention, there is disclosed, a method for forming a thin film, having a prescribed sheet resistance, comprising: forming a first semiconductor layer of SIPOS, forming a second semiconductor layer of polycrystal silicon on said first semiconductor layer, forming at least a third semiconductor layer of SIPOS on said second semiconductor layer, controlling a first resistivity of said first and third semiconductor layers to a value substantially higher than a second resistivity of said second semiconductor layer, and controlling said first and second resistivities to produce said prescribed sheet resistance.

According to another embodiment of the present invention, there is disclosed, a method for forming a thin film, having a prescribed sheet resistance, comprising: forming a first semiconductor layer made of SIPOS, forming a second semiconductor layer made of a doped polycrystal silicon on said first semiconductor layer, forming at least a third semiconductor layer composed of SIPOS on said second semiconductor layer, controlling a first resistivity of said first and third semiconductor layers to a value substantially higher than a second resistivity of said second semiconductor layer, and controlling said first and second resistivities to produce said prescribed sheet resistance.

According to yet another embodiment of the present invention, there is disclosed, a method for forming a thin film, having a prescribed sheet resistance, comprising: forming a first semiconductor layer made of SIPOS, forming a second semiconductor layer also made of SIPOS on said first semiconductor layer, forming at least a third semiconductor layer composed of SIPOS on said second semiconductor layer, and controlling an oxygen concentration in said first, second and third semiconductor layers during the steps of forming thereof to values effective to produce a first resistivity in said first and third semiconductor layers substantially higher than a second resistivity of said second semiconductor layer, whereby said prescribed sheet resistance is attained.

According to yet another embodiment of the present invention, there is described, a thin film comprising: a stack of at least first, second and third alternately formed semiconductor layers, said first semiconductor layer having a first resistivity which is substantially higher than a second resistivity of said second semiconductor layer, said third semiconductor layer having a third resistivity higher than second resistivity, and said first, second and third resistivities providing a desired sheet resistivity.

According to yet another embodiment of the present invention, there is disclosed, a thin film comprising: a first layer of SIPOS, a second layer of silicon, a third layer of SIPOS, said second layer being substantially crystalline silicon, crystals of said crystalline silicon having a maximum thickness-wise dimension no larger than a thickness of said second layer, and thicknesses of said first, second and third layers providing a desired sheet resistivity of said thin film.

In order to achieve the above objects, the method for forming thin film of the present invention comprises: forming said film by alternating between layers having a relatively high resistance and layers having a relatively low resistance so that the entire film has a prescribed sheet resistance. The high-resistance layers preferably comprise a semi-insulating polycrystal silicon (SIPOS) layer to which oxygen has been doped. The low-resistance layers preferably comprise an impurity element serving as a dopant, with heat being applied after they are stacked with the high-resistance layers. The low-resistance layers may also comprise a polycrystal silicon. In the latter case, the polycrystal silicon may be doped with an impurity element. Furthermore, both the low-resistance layers and the high-resistance layers may be comprised of SIPOS, with the resistance being controlled by the concentration of oxygen doping.

When a thin film is formed by alternately stacking layers that conduct electricity freely and layers that do not, the sheet resistance of the entire film varies according to the number of stacked layers and differences in thickness. While the film comprises a stack of discrete high-resistance layers and low-resistance layers, macroscopically, there is no resistance gradient across the depth of the film. The resistance of the low-resistance layers is controlled using the impurity element used for doping. If a film is formed from SIPOS layers and layers of an impurity element serving as a dopant and this film is heated, the distinction between the high-resistance layers and the low-resistance layers becomes unclear. The resistance of the entire thin film can be adjusted by changing the amount of dopant introduced into the low resistance layers.

The above, and other objects, features and advantages of the present invention will become apparent from the following description read in conjunction with the accompanying drawings, in which like reference numerals designate the same elements.

BRIEF DESCRIPTION OF THE DRAWINGS

FIG. 7($b$) is a cross-section drawing showing the thin film obtained from the third embodiment after heat treatment.

DETAILED DESCRIPTION OF THE PREFERRED EMBODIMENTS

According to the present invention, a stack of alternately deposited high-resistance layers and low-resistance layers forms a thin film having a prescribed overall sheet resistance. The thin film has a substantially zero depth-wise gradient in resistance. The film is suited for use as a high-resistance insulating film that is required to prevent the accumulation of electrical charge. The sheet resistance of the film is controlled by adjusting the concentration of doping impurities. Because an in situ doping process is used, in which doping and film formation are effected simultaneously, a separate procedure for introducing impurities may be omitted. Because the stack can be formed within the same CVD reaction vessel with only the reactive gasses being changed, the film is formed in a minimal number of steps. The following is a description of four specific embodiments of the present invention.

Embodiment 1

Figure 1:
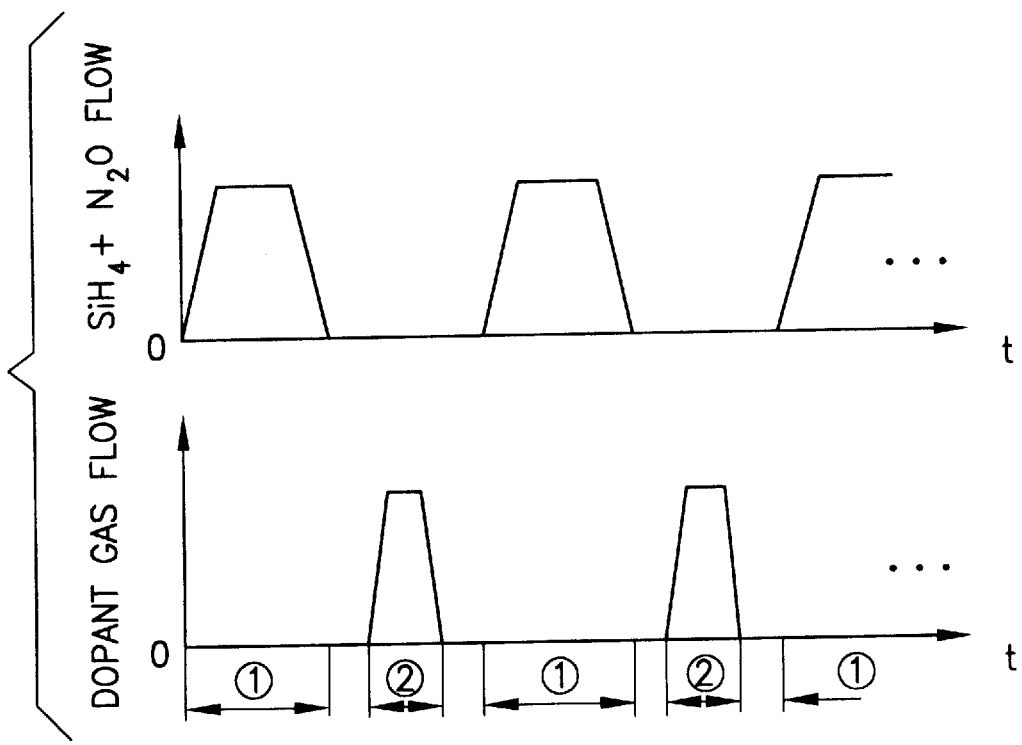
FIG. 1 is a timing sequence diagram of the flow of reactive gasses into the film formation process according to a first embodiment of the present invention.

Referring to FIG. 1, timed sequences for the introduction of gasses into a CVD reaction vessel for embodiment 1 are shown. The upper portion shows the sequence for the introduction of a mixed gas of $SiH_4$ and $N_2O$ into a CVD reaction vessel. The lower portion shows the sequence for the introduction of a compound gas of impurities serving as a dopant, such as $PH_3$, $B_2H_6$, or $AsH_3$, into a CVD reaction vessel.

Figure 2:
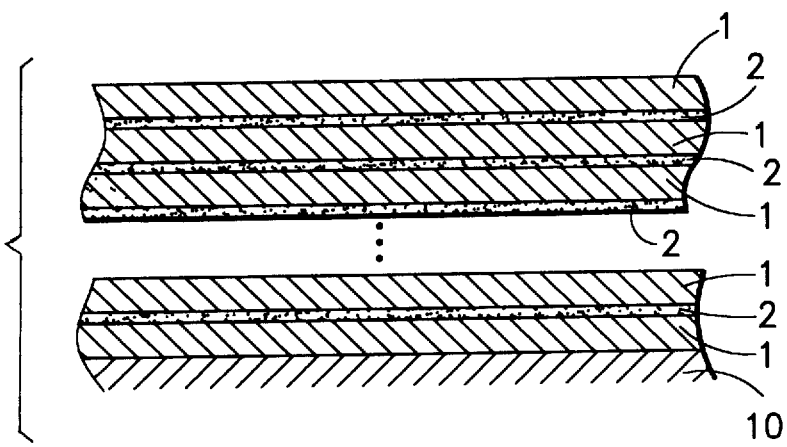
FIG. 2 is a cross-section of the thin film obtained from the first embodiment.

Referring also to FIG. 2, the process of embodiment 1 is as follows. The CVD reaction vessel is heated to a prescribed film formation temperature in the range of 500°–680° C. under a vacuum. Then, a gas mixture of $SiH_4$ and $N_2O$ is introduced into the reaction vessel. This forms a SIPOS layer 1 on a substrate 10. Then, introduction of the mixed gas of $SiH_4$ and $N_2O$ is halted and a vacuum exhaustion is performed to remove these gasses. Once the $SiH_4$ and $N_2O$ gasses are adequately removed, a reactive gas from a dopant compound such as $PH_3$, $B_2H_6$, or $AsH_3$ is introduced into the CVD reaction vessel. This forms a dopant layer 2 on the surface of SIPOS layer 1. Then, the introduction of the reactive gas for dopant layer 2 is halted and the vacuum exhaustion is performed again to clear the reaction vessel. The above steps are repeated to deposit successive SIPOS layers 1 and dopant layers 2 as shown in FIG. 2.

The stack formed by the foregoing process is heat treated in, for example, a nitrogen atmosphere for 40 minutes at 900° C. The heating causes the impurities from dopant layers 2 to diffuse into SIPOS layers 1. Since each SIPOS layer 1, except for the bottom and top, receive dopant from dopant layers 2 on both sides, and the top and bottom SIPOS layers 1 receive dopant from one side, substantially uniform thickness-wise doping of the entire stack of SIPOS layers 1 results. Thus, the thickness-wise dopant gradients shown in FIG. 3 for prior-art SIPOS films is substantially avoided.

Figure 3:
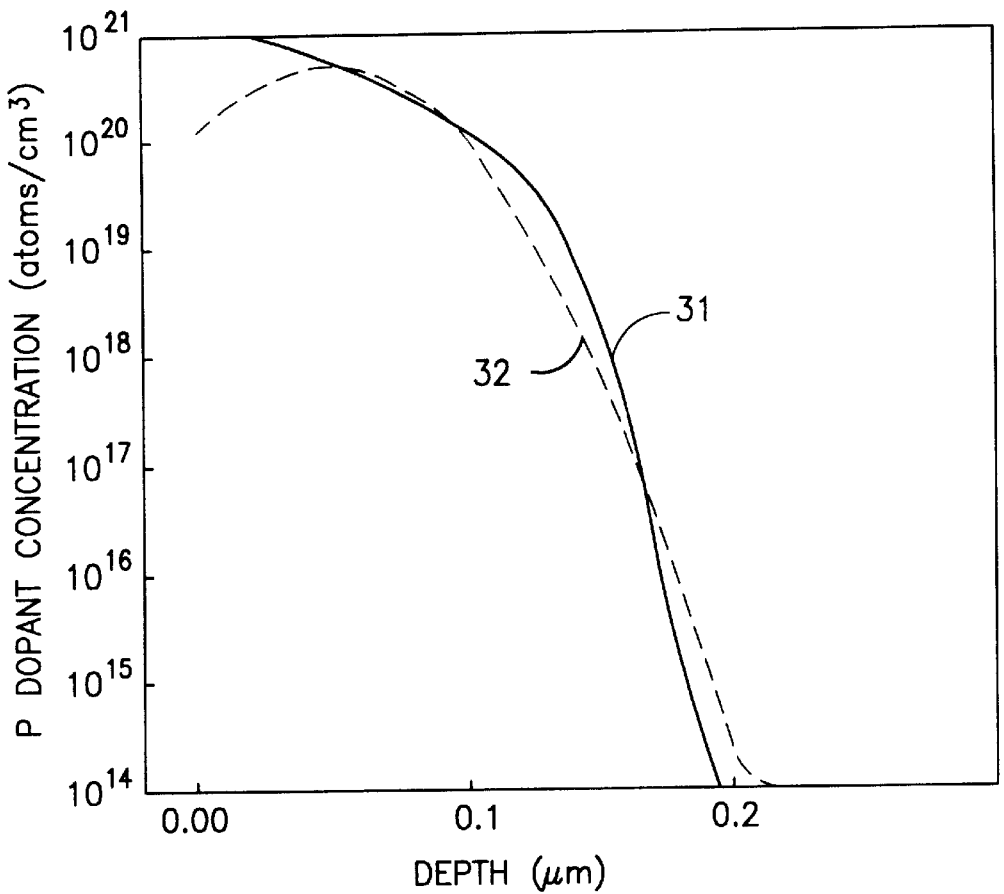
FIG. 3 is a concentration distribution diagram of the depth-wise P concentration when P is introduced from the surface after SIPOS film formation.

The resulting overall resistance of the first embodiment stack after diffusion is adjusted by changing the film thickness by control of the formation time for the SIPOS layers 1, the flow rate of the gasses, and the time span for the introduction of the compound gas used to form dopant layers 2. If SIPOS layers 1 are thin, then a uniform depth-wise dopant concentration is formed. Conversely, if SIPOS layers 1 are thick, a concentration gradient as shown in FIG. 3 is formed within each SIPOS layer 1 of the film because the diffusion constant of the impurities in SIPOS is lower than a simple polycrystal silicon. Thus, some highly conductive layers can be formed as part of the stack while, at in the same stack, some layers can be given high sheet resistivity. The difference in thickness of the layers changes the overall resistance of the first embodiment stack. For these reasons, with a constant overall thickness of the film stack, the overall resistance of the film can be controlled by the thicknesses of SIPOS layers 1 and dopant layers 2 and the number of stacked layers used to make the film.

EXAMPLE 1

A specific example of the process of embodiment 1 is as follows: SIPOS layer 1 is formed by introducing a mixture gas of $SiH_4$ and $N_2O$ to a CVD reaction vessel for a specified period of time. Then a dopant gas, $PH_3$, is introduced into the CVD reaction vessel for another specified period of time, forming dopant layer 2 on the surface of SIPOS layer 1. The deposit of dopant layer 2 is continued to produce a thickness of 500 Å. The process for forming SIPOS layer 1 is repeated. Successive alternating layers of dopant layer 2 and SIPOS layer 1 are stacked. The resulting first embodiment stack is heated in a nitrogen atmosphere for 40 minutes at 900° C. The concentration of impurities in the overall film is on the order of at least $10^{19}$ atoms/cc. The impurities within the films form layers that easily conduct electricity, if SIPOS layers 1 are thin, and form layers that are poor conductors if the SIPOS 1 layers are thick. The first embodiment stack has a macroscopically uniform concentration of impurities. If the steepness of the concentration gradient of the introduced impurities is kept under control, even a minimum deposition stack, containing only one dopant layer 2 with SIPOS layers 1 formed above and below it, exhibits the advantages of the present invention.

Embodiment 2

Figure 4:
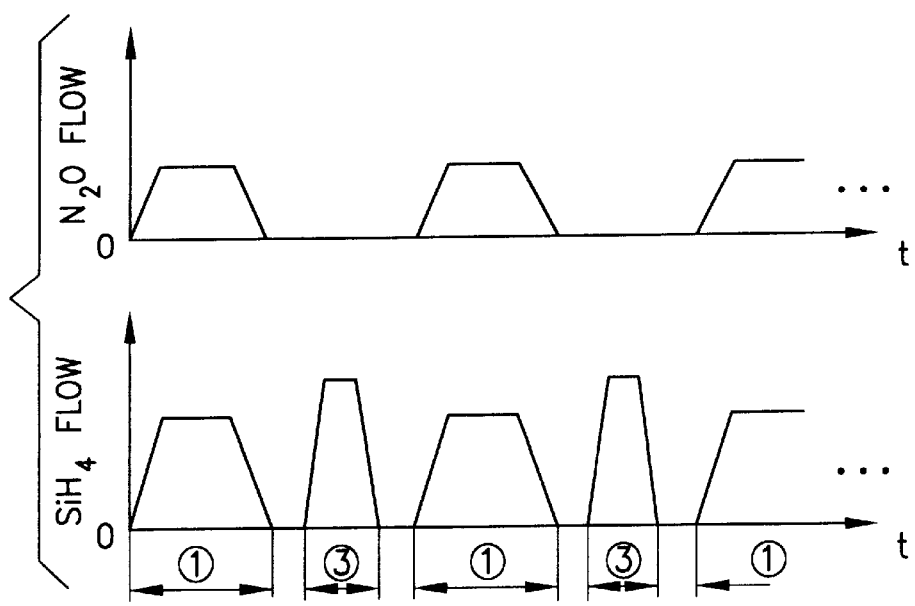
FIG. 4 is a timing sequence diagram of the flow of reactive gasses into the film formation process according to a second embodiment of the present invention.
Figure 5:
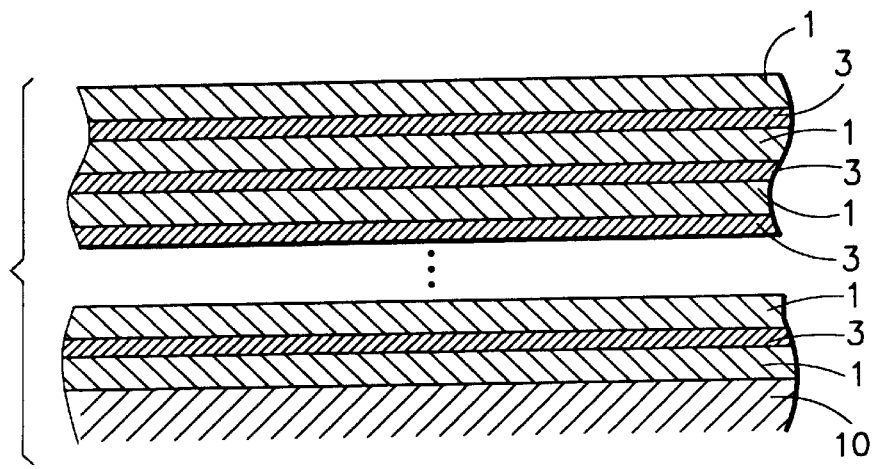
FIG. 5 is a cross-section of the thin film obtained from the second embodiment.

Referring to FIGS. 4 and 5, timed sequences for the introduction of gasses into a CVD reaction vessel are shown for embodiment 2. First, a mixed gas of $SiH_4$ and $N_2O$ is introduced into the CVD reaction vessel for a specified period of time. This forms SIPOS layer 1 on substrate 10. Then, $SiH_4$ gas alone is introduced for another specified period of time and a polycrystal Si layer 3 is formed. The two deposition steps are repeated to produce a stack of alternating SIPOS layers 1 and polycrystal Si layers 3, shown in FIG. 5. In this embodiment, dopant impurities such as P, As, B are omitted. Instead, the overall resistance of the film is controlled using the difference in resistivity between polycrystal Si, having a resistivity of $10^6$ ohm·cm, and SIPOS, having a resistivity of $10^7$ ohm·cm. The parameters that determine the resulting resistance are the relative thicknesses of polycrystal Si layers 3 and SIPOS layers 1, the film formation temperature, and the number of layers forming the stack. Compared to the first embodiment stack where impurities are introduced, the resulting sheet resistance of the second embodiment stack is higher. However, the sheet resistance of the second embodiment stack is lower than that achievable using SIPOS layer 1 alone. The absence of introduced impurities prevents changes in resistance due to necessary heat treatment. The inventors have discovered that this resistance stability is maintained even after heat treatment for five hours at 1100° C.

Embodiment 3

Figure 6:
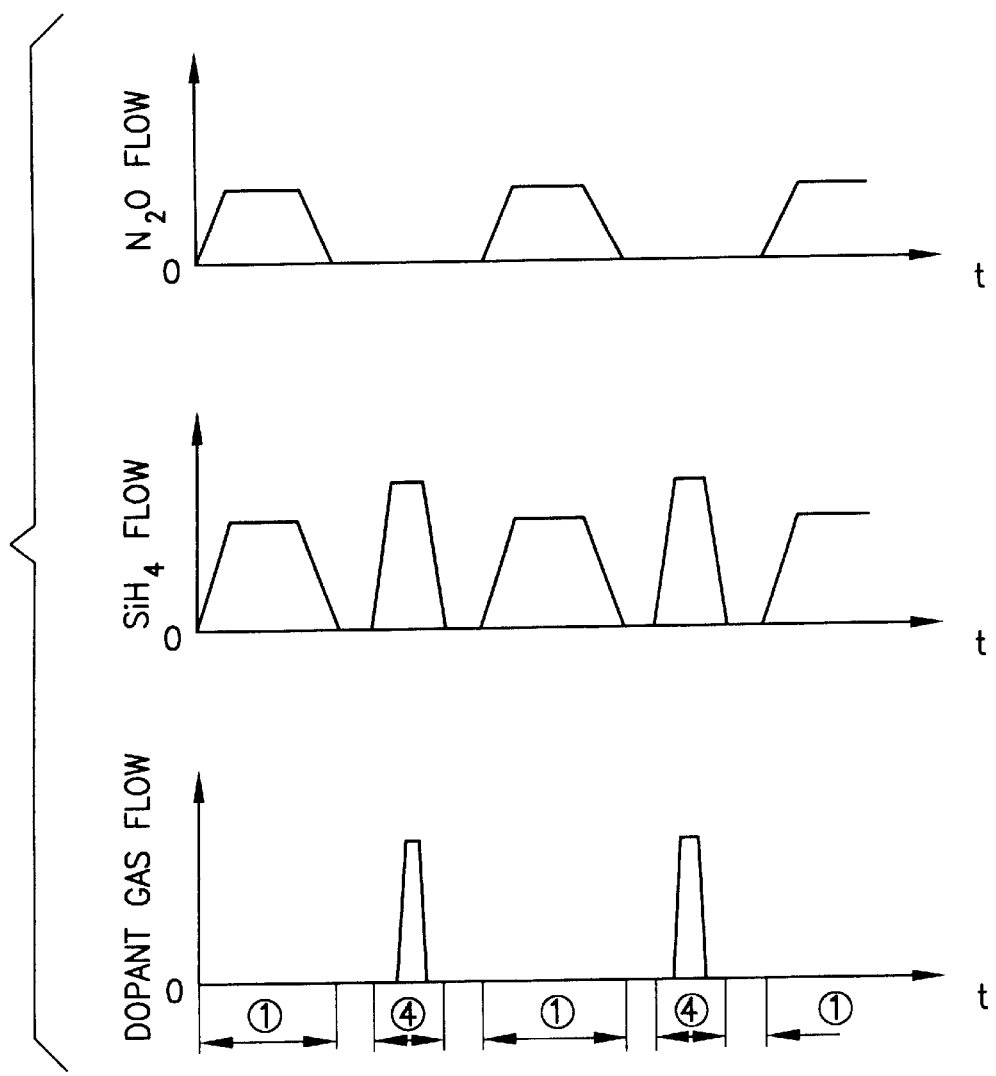
FIG. 6 is a timing sequence diagram of the flow of reactive gasses into the film formation process according to a third embodiment of the present invention.
Figure 7A:
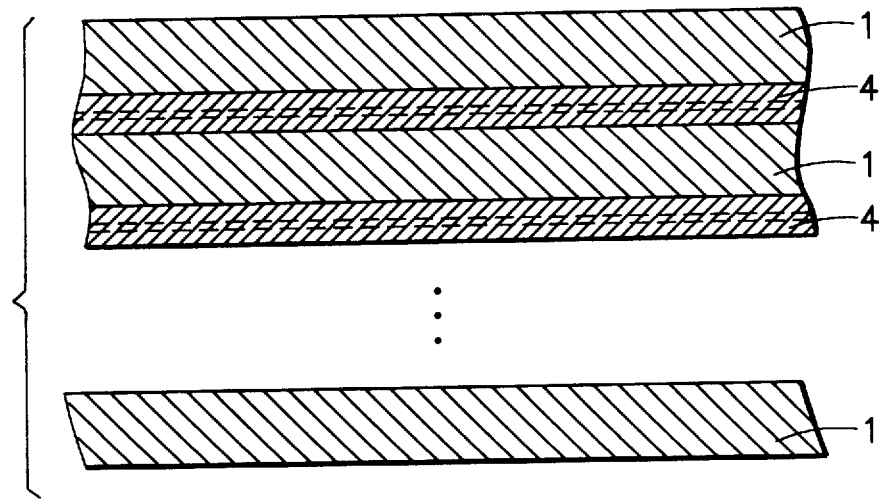
FIG. 7($a$) is a cross-section drawing showing the thin film obtained from the third embodiment before heat treatment.
Figure 7B:
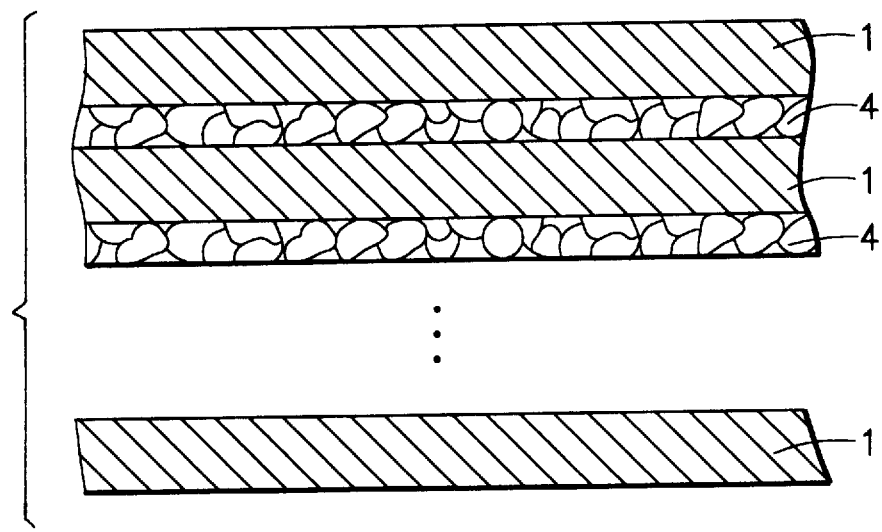

Referring to FIG. 6, timing sequences for the introduction of gasses for embodiment 3 are shown. Referring now also to FIGS. 7(a) and 7(b), as in embodiment 2, a third embodiment stack is formed from alternating layers of polycrystal Si and SIPOS. However, a reactive gas, of $PH_3$, $B_2H_6$ or $AsH_3$ for example, for is introduced into the CVD reaction vessel, discretely or continuously, during the formation of the polycrystal layer to form a doped polycrystal Si layer, as shown in FIG. 7(a). The presence of the dopants, such as P, B, or As, increases the self-diffusion coefficient of Si. As a result of the increase in the self-diffusion coefficient, when heat is applied for ten minutes in a 900° C. nitrogen atmosphere, the crystal particles of doped polycrystal Si layer 4 grow significantly, as shown in FIG. 7(b). The crystal growth of the doped polycrystal Si layer 4 decreases the sheet resistance of the film. However, because the third embodiment stack is formed with alternate SIPOS layers 1, the size of the crystal particles is limited to the thickness of doped polycrystal Si layer 4.

Figure 8:
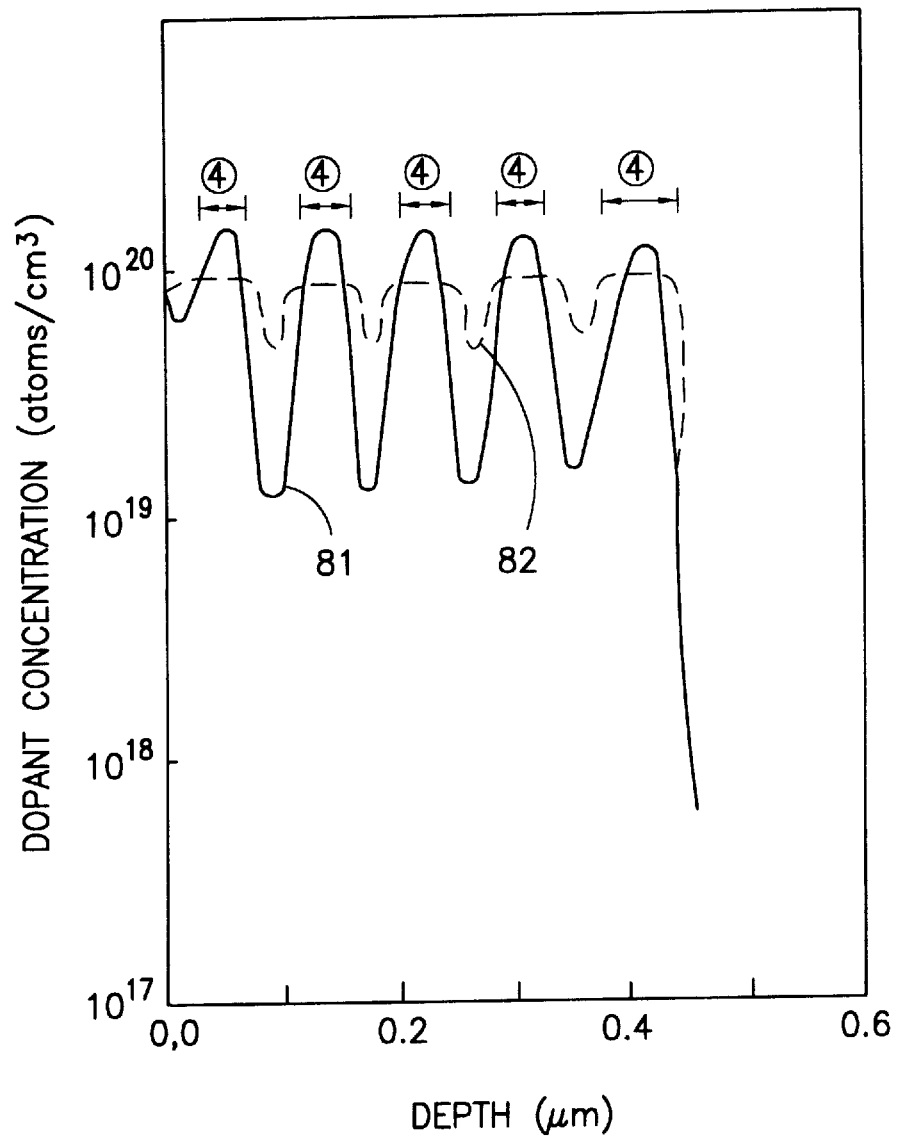
FIG. 8 is a dopant concentration distribution chart showing depth-wise dopant concentration in the thin film obtained from the third embodiment.

Referring to FIG. 8, an example of a depth-wise dopant concentration profile of the third embodiment stack is shown. A solid line 81 indicates the dopant concentration before heat treatment. A dashed line 82 indicates the dopant concentration after heat is applied for 40 minutes at 900° C. The resulting conductivity is higher than embodiment 2 because embodiment 3 contains impurities. This allows doped polycrystal Si layer 4 to be formed thinner than polycrystal Si layer 3 for the same sheet resistance. Therefore, thinner films are produced with embodiment 3.

Embodiment 4

Figure 9:
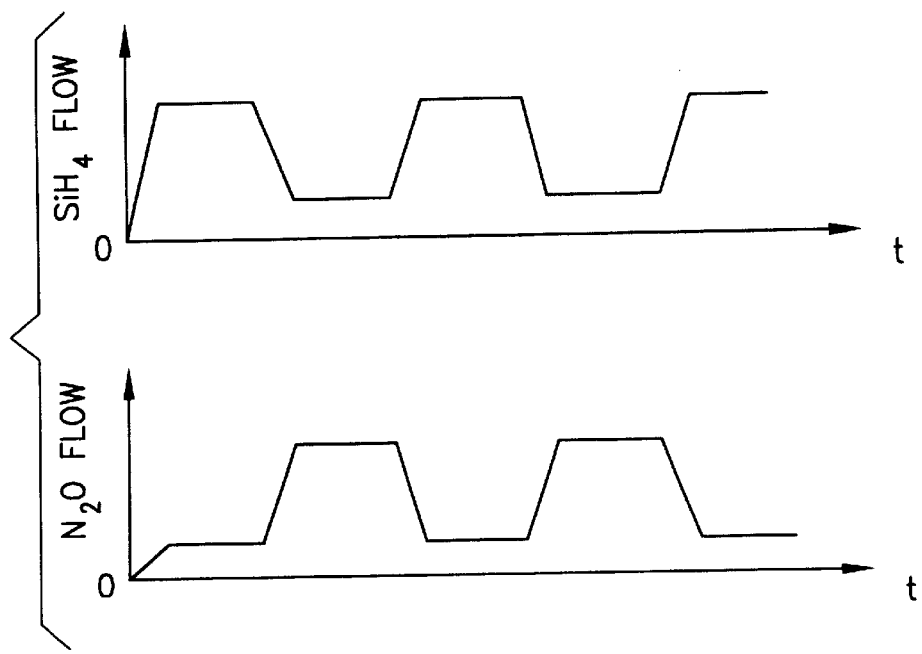
FIG. 9 is a timing sequence diagram of the flow of reactive gasses into the film formation process according to a fourth embodiment of the present invention.
Figure 10:
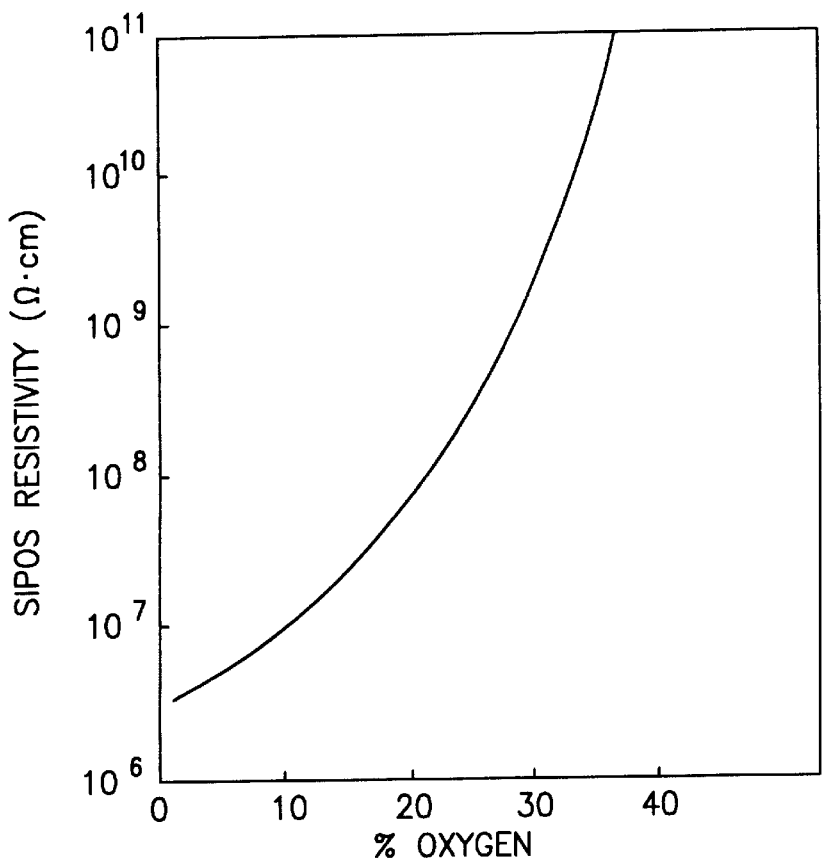
FIG. 10 is a graph indicating the relationship between the resistivity and oxygen concentration of SIPOS.

Referring to FIG. 9, timing sequences for changing the flow ratios of the gasses introduced into a CVD reaction vessel for embodiment 4 are shown. SIPOS resistance changes according to oxygen concentration. Referring now also to FIG. 10, the relationship between SIPOS resistance and oxygen concentration is shown. By changing the flow ratios of $SiH_4$ and $N_2O$, which are the source gasses for film formation of SIPOS, the concentration of $O_2$ in the film is controllable within a range of 10–20 percent. Repeating these changes in the flow ratios of $SiH_4$ and $N_2O$, the resistance of the resultant film is controlled by forming SIPOS layers that easily conduct and SIPOS layers that are more resistive. The parameters for controlling resistance in this embodiment are the flow ratios used, the thickness of each of the layers, and the film formation temperature. As in embodiment 2, no impurities are introduced, the resistance remains even after heat treatment at temperatures up to 1100° C.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A method for forming a thin film having a prescribed sheet resistance, comprising steps of:

forming a first deposition layer made substantially of a first material on a substrate;

said first material being semi-insulating polycrystalline silicon (SIPOS);

then forming at least one second deposition layer and at least one third deposition layer to form a stack of alternating layers of said at least one second deposition layer then said at least one third deposition layer, said stack being formed on said first deposition layer on said substrate, wherein said at least one second deposition layer is made substantially from a second material and said at least one third deposition layer is made substantially from said first material;

said thin film being composed of said first deposition layer, said at least one second deposition layer, and said at least one third deposition layer;

said steps of forming each of said first deposition layer and said at least one third deposition layer including;

heating a chemical vapor deposition (CVD) reaction vessel to a first film formation temperature;

thereafter, drawing a first vacuum in said CVD reaction vessel;

thereafter, introducing a mixed gas of $SiH_4$ and $N_2O$ into said CVD reaction vessel at a first flow rate and for a first period of time; and controlling said first flow rate and said first period of time to produce a first resistivity when forming said first layer and said third layer;

said step of forming said at least one second deposition layer including;

heating said CVD reaction vessel to a second film formation temperature;

drawing a second vacuum in said CVD reaction vessel;

thereafter, introducing a reactive gas containing a dopant into said CVD reaction vessel at a second flow rate and for a second period of time; and controlling said second flow rate and said second period of time to produce a second resistivity when forming said second layer;

said first resistivity being substantially greater than said second resistivity, but there is no resistance gradient thickness-wise for an entire thickness of said thin film; and heating said thin film at an annealing temperature and for a third period of time effective to cause diffusion of said dopant from said at least one second deposition layer into said first deposition layer and said at least one third deposition layer after said thin film is formed, to produce said prescribed sheet resistance of said thin film, whereby said prescribed sheet resistance is made substantially uniform thickness-wise throughout the entire thickness of said thin film.

2. The method of claim 1, wherein said first film formation temperature is between about 500° to about 680° C.

3. The method of claim 1, wherein said second film formation temperature is between about 500° to about 680° C.

4. The method of claim 1, further comprising:

heating said film to said annealing temperature of about 900° C. in a nitrogen atmosphere for said third period of time equal to 40 minutes to cause said diffusion of said dopant from said at least one second deposition layer into said first deposition layer and said at least one third deposition layer.

5. The method of claim 1, wherein said dopant is selected from the group consisting of P, B, and As.

6. The method of claim 1 wherein said controlling said first resistivity includes controlling thicknesses of said first deposition layer and said at least one third deposition layer.

7. The method of claim 6 wherein said first deposition layer and said at least one third deposition layer have equal thicknesses.

8. The method of claim 6 wherein each of said first deposition layer and said at least one third deposition layer have different thicknesses.

9. The method of claim 1 wherein controlling said second resistivity includes controlling a thickness of said at least one second deposition layer.

10. The method of claim 1 wherein controlling said second resistivity includes adjusting a dopant concentration of said at least one second deposition layer.

11. A method for forming a thin film as described in claim 1, wherein a total number of layers is an odd number of at least 3.

12. A method for forming a thin film having a prescribed sheet resistance, comprising steps of:

forming a first deposition layer made substantially of a first material on a substrate;

then forming at least one second deposition layer and at least one third deposition layer to form a stack of alternating layers of said at least one second deposition layer then said at least one third deposition layer, said stack being formed on said first deposition layer on said substrate, wherein said at least one second deposition layer is made substantially from a second material and said at least one third deposition layer is made substantially from said first material;

said first material having first resistivity;

said second material having a second resistivity;

said first resistivity being substantially greater than said second resistivity, but there is no resistance gradient thickness-wise for an entire thickness of said thin film;

said thin film being composed of said first deposition layer, said at least one second deposition layer, and said at least one third deposition layer;

said steps of forming each of said first deposition layer and said at least one third deposition layer including;

heating a chemical vapor deposition (CVD) reaction vessel to a first film formation temperature;

thereafter, drawing a first vacuum in said CVD reaction vessel;

thereafter, introducing a mixed gas of $SiH_4$ and $N_2O$ into said CVD reaction vessel at a first flow rate and for a first period of time; and controlling said first flow rate and said first period of time to produce said first resistivity when forming said first material;

said step of forming at least one second deposition layer including;

heating said CVD reaction vessel to a second film formation temperature;

thereafter, drawing a second vacuum in said CVD reaction vessel;

thereafter, introducing SiH$_4$ gas containing a dopant into said CVD reaction vessel at a second flow rate and for a second period of time to form a polycrystal silicon layer; and thereafter, releasing said vacuum; and heating said thin film at an annealing temperature and for a third period of time effective to cause diffusion of said dopant from said at least one second deposition layer into said first deposition layer and said at least one third deposition layer after said thin film is formed, to produce said prescribed sheet resistance of said thin film, whereby said prescribed sheet resistance is made substantially uniform thickness-wise throughout the entire thickness of said thin film.

13. The method of claim 12 wherein said step of heating said thin film includes heating to said annealing temperature of about 900° C. in a nitrogen atmosphere for said third period of time equal to about 40 minutes.

14. The method of claim 12, wherein said dopant is selected from the group consisting of P, B, and As.

15. A method for forming a thin film having a prescribed sheet resistance, comprising steps of:

forming a first deposition layer made of semi-insulating polycrystalline silicon (SIPOS) on a substrate;

then forming at least one second deposition layer containing a dopant and at least one third deposition layer made of SIPOS to form a stack of alternating layers of said at least one second deposition layer then said at least one third deposition layer, said stack being formed on said first deposition layer on said substrate;

said first deposition layer, said at least one second deposition layer, and said at least one third deposition layer forming said thin film;

said first deposition layer and said third deposition layer having a first resistivity;

said second deposition layer having a second resistivity;

said first resistivity being substantially greater than said second resistivity, but there is no resistance gradient thickness-wise for an entire thickness of said thin film; and modifying said first resistivity and said second resistivity to produce said prescribed sheet resistance of said thin film, said step of modifying including diffusing said dopant from said at least one second deposition layer into said first deposition layer and said at least one third deposition layer, wherein said prescribed sheet resistance of said thin film is between said first resistivity and said second resistivity, and said prescribed sheet resistance of said thin film is substantially uniform thickness-wise throughout the entire thickness of said thin film.

16. A method for forming a thin film having a prescribed sheet resistance, comprising steps of:

forming a first deposition layer made of semi-insulating polycrystalline silicon (SIPOS) on a substrate;

then forming at least one second deposition layer made of a doped polycrystal silicon and at least one third deposition layer made of SIPOS to form a stack of alternating layers of said at least one second deposition layer then said at least one third deposition layer, said stack being formed on said first deposition layer on said substrate;

said first deposition layer, said at least one second deposition layer, and said at least one third deposition layer forming said thin film;

said first deposition layer and said third deposition layer having a first resistivity;

said second deposition layer having a second resistivity;

said first resistivity being substantially greater than said second resistivity, but there is no resistance gradient thickness-wise for an entire thickness of said thin film; and modifying said first resistivity and said second resistivity to produce said prescribed sheet resistance of said thin film, said step of modifying including diffusing said dopant from said at least one second deposition layer into said first deposition layer and said at least one third deposition layer, wherein said prescribed sheet resistance of said thin film is between said first resistivity and said second resistivity, and said prescribed sheet resistance of said thin film is substantially uniform thickness-wise throughout the entire thickness of said thin film.

\* \* \* \* \*